US012742821B2

(12) United States Patent
Agarwal et al.

(10) Patent No.: US 12,742,821 B2
(45) Date of Patent: Sep. 22, 2026

(54) SYSTEMS AND METHODS FOR INTELLIGENT MANAGEMENT OF A BATTERY

(71) Applicant: Samsung Electronics Co., Ltd., Suwon-si (KR)

(72) Inventors: Samarth Agarwal, Bangalore (IN); Sangheon Lee, Suwon-si (KR); Krishnan S Hariharan, Bangalore (IN); Seongho Han, Suwon-si (KR); Roshan Bharti, Bangalore (IN); Ankit Yadu, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 493 days.

(21) Appl. No.: 18/296,618

(22) Filed: Apr. 6, 2023

(65) Prior Publication Data

US 2023/0243892 A1 Aug. 3, 2023

Related U.S. Application Data

(63) Continuation of application No. PCT/KR2022/019398, filed on Dec. 1, 2022.

(30) Foreign Application Priority Data

Dec. 1, 2021 (IN) ............................ 202141055766

(51) Int. Cl.

*G01R 31/367* (2019.01)
*G01R 31/382* (2019.01)
(Continued)

(52) U.S. Cl.

CPC ......... *G01R 31/367* (2019.01); *G01R 31/382* (2019.01); *H01M 10/425* (2013.01);
(Continued)

(58) Field of Classification Search

CPC ...... G01R 31/367; G01R 31/36; G01R 31/00; G01R 31/382; H01M 10/425;
(Continued)

(56) References Cited

U.S. PATENT DOCUMENTS

| | | | |
|---|---|---|---|
| 10,491,022 B2 | 11/2019 | Mirtabatabaei et al. | |
| 2011/0309840 A1* | 12/2011 | Yamaguchi | B60L 3/0046 320/132 |

(Continued)

FOREIGN PATENT DOCUMENTS

| | | |
|---|---|---|
| CN | 109165687 A | 1/2019 |
| CN | 111007401 A | 4/2020 |

(Continued)

OTHER PUBLICATIONS

Indian Office Action dated Sep. 17, 2024, issued in Indian Patent Application No. 202141055766.

(Continued)

*Primary Examiner* — Mohamed Charioui
(74) *Attorney, Agent, or Firm* — Jefferson IP Law, LLP

(57) ABSTRACT

A method, for intelligent management of a battery is provided. The method includes detecting at least one anomaly associated with the battery. The at least one anomaly impacts one or more operations of the battery. The method includes identifying at least one portion of data from reference charging data to include the at least one anomaly for managing the one or more operations of the battery. The method further includes modifying at least one portion of data from the reference charging data based on a predetermined logic to include the at least one anomaly. The method also includes retraining an Artificial Intelligence (AI) model based on the reference charging data upon modification for managing the one or more operations of the battery.

18 Claims, 5 Drawing Sheets

(51) Int. Cl.
*H01M 10/42* (2006.01)
*H01M 10/48* (2006.01)

(52) U.S. Cl.
CPC .... *H01M 10/48* (2013.01); *H01M 2010/4271* (2013.01); *H01M 2010/4278* (2013.01)

(58) Field of Classification Search
CPC ...... H01M 10/42; H01M 10/00; H01M 10/48; H01M 2010/4271; H01M 2010/4278; B60L 53/62; B60L 53/60; B60L 53/00; B60L 3/0046; B60L 3/0023; B60L 3/00; B60L 58/10; B60L 58/00; H02J 7/0048; H02J 7/0047; H02J 7/00
See application file for complete search history.

(56) References Cited

U.S. PATENT DOCUMENTS

| | | | | |
|---|---|---|---|---|
| 2017/0364792 | A1 | 12/2017 | Chai et al. | |
| 2019/0120908 | A1* | 4/2019 | Naha | G01R 31/367 |
| 2020/0081070 | A1 | 3/2020 | Chemali et al. | |
| 2020/0278398 | A1 | 9/2020 | Isa et al. | |
| 2020/0280108 | A1* | 9/2020 | Tomar | H01M 10/482 |
| 2020/0355749 | A1 | 11/2020 | Takahashi et al. | |
| 2021/0266145 | A1 | 8/2021 | Chen et al. | |
| 2022/0065940 | A1* | 3/2022 | Sudarsan | G01R 31/392 |

FOREIGN PATENT DOCUMENTS

| | | | |
|---|---|---|---|
| CN | 111611669 | A | 9/2020 |
| EP | 1 691 209 | B1 | 10/2008 |
| WO | 2020/099911 | A1 | 5/2020 |

OTHER PUBLICATIONS

Jichao Hong et al., Fault Prognosis of Battery System based on Accurate Voltage Abnormity Prognosis using Long Short-Term Memory Neural Networks, Oct. 1, 2019.
Ahmed N. Abdalla et al., Integration of Energy Storage System and Renewable Energy Sources based on Artificial Intelligence: An overview, Aug. 31, 2021.
International Search Report dated Mar. 9, 2023, issued in International Patent Application No. PCT/KR2022/019398.
Indian Office Action dated Mar. 5, 2026, issued in Indian Application No. 202141055766.

* cited by examiner

200

238
Battery Sensor
(current, voltage, resistance, etc.)
232
Network
206
Memory
210
Module(s)
214
Detection Engine
218
Modification Engine
222
Generation Engine
226
Disk Drive Unit
230
Instructions
236
204
Processor
208
Data
212
Resource(s)
216
Identification Engine
220
Retaining Engine
224
Input Device
228
Medium
234
Communication Port

SYSTEMS AND METHODS FOR INTELLIGENT MANAGEMENT OF A BATTERY

CROSS-REFERENCE TO RELATED APPLICATION(S)

This application is a continuation application, claiming priority under § 365(c), of an International application No. PCT/KR2022/019398, filed on Dec. 1, 2022, which is based on and claims the benefit of an Indian patent application number 202141055766, filed on Dec. 1, 2021, in the Indian Patent Office, the disclosure of which is incorporated by reference herein in its entirety.

FIELD OF THE INVENTION

The disclosure relates to management of a battery. More particularly, the disclosure relates to systems and methods for an on-device intelligent management of the battery.

BACKGROUND

Traditionally, methods for battery fault detection, do not detect faults with a high enough accuracy. With the proliferation of Li-ion batteries in smart phones, safety is the main concern and an on-line detection of battery faults is much wanting. Battery faults are very critical since they are often ascribed to be the cause of many accidents involving Li-ion batteries.

Currently, batteries are managed by performing required measurements offline after pulling the battery out of the device at periodic intervals. Furthermore, a heavy data processing and specialized measurements are required for management of the battery. Existing methods for managing the battery can only work on data that it has seen before Thus, there is a need for a solution that overcomes the above deficiencies.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a selection of concepts, in a simplified format, that are further described in the detailed description of the disclosure. This summary is neither intended to identify key or essential inventive concepts of the disclosure and nor is it intended for determining the scope of the disclosure.

Additional aspects will be set forth in part in the description which follows, and in part, will be apparent from the description, or may be learned by practice of the presented embodiments.

In accordance with an aspect of the disclosure, a method, for intelligent management of a battery is provided. The method includes detecting at least one anomaly associated with the battery. The at least one anomaly impacts one or more operations of the battery. The method includes identifying at least one portion of data from reference charging data to include the at least one anomaly for managing the one or more operations of the battery. The method further includes modifying at least one portion of data from the reference charging data to include the at least one anomaly. The method also includes retraining an artificial intelligence (AI) model based on the reference charging data upon modification for managing the one or more operations of the battery.

In accordance with another aspect of the disclosure, a system, for intelligent management of a battery is provided. The system includes detecting, by a detection engine, at least one anomaly associated with the battery. The at least one anomaly impacts one or more operations of the battery. The system includes identifying, by an identification engine, at least one portion of data from reference charging data to include the at least one anomaly for managing the one or more operations of the battery. The system further includes modifying, by a modification engine, at least one portion of data from the reference charging data to include the at least one anomaly. The system also includes retraining, by a retraining engine, an artificial intelligence (AI) model based on the reference charging data upon modification for managing the one or more operations of the battery.

To further clarify advantages and features of the disclosure, a more particular description of the disclosure will be rendered by reference to specific embodiments thereof, which is illustrated in the appended drawings. It is appreciated that these drawings depict only typical embodiments of the disclosure and are therefore not to be considered limiting of its scope. The disclosure will be described and explained with additional specificity and detail with the accompanying drawings.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION OF FIGURES

Figure 1:
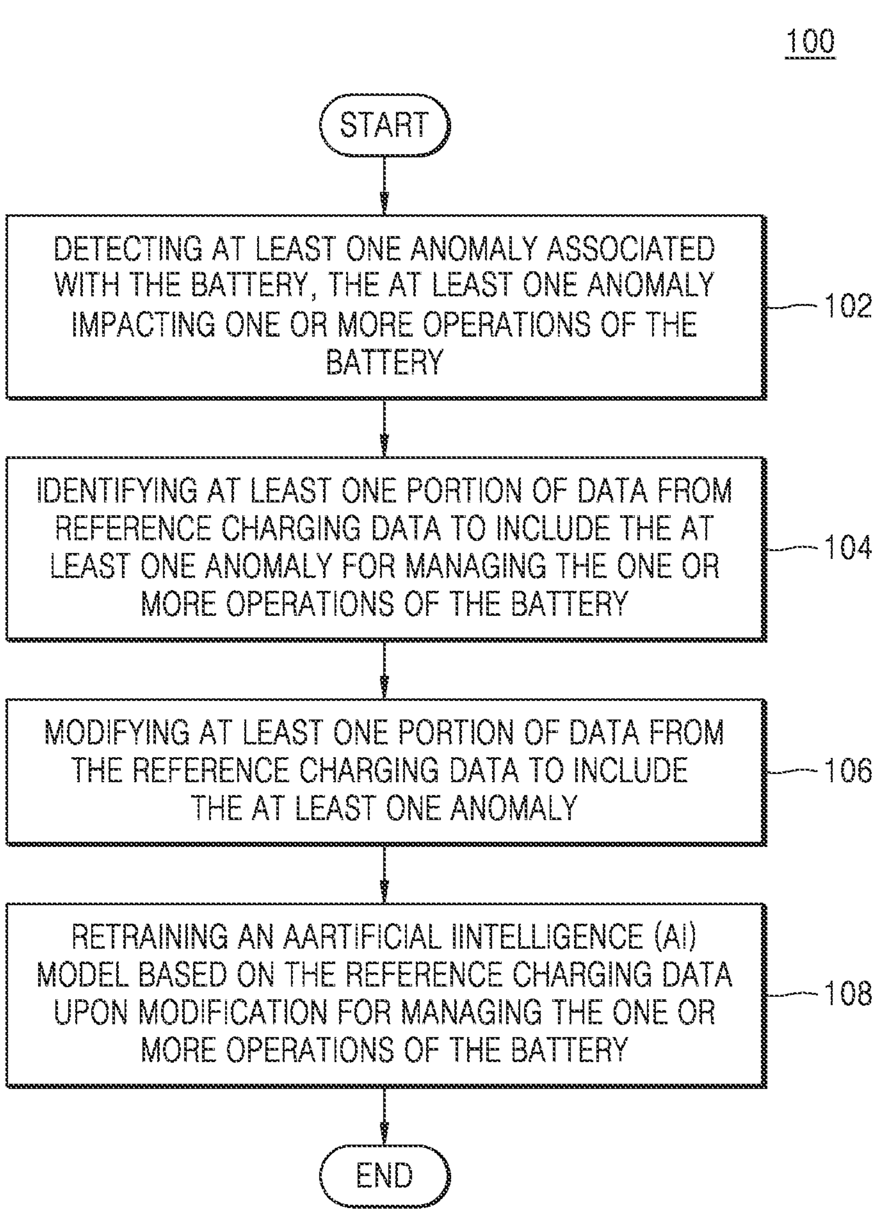
FIG. 1 illustrates a schematic block diagram depicting a method for intelligent management of a battery, according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood by those skilled in the art that the foregoing general description and the following detailed description are explanatory of the disclosure and are not intended to be restrictive thereof.

Reference throughout this specification to "an aspect", "another aspect" or similar language means that a particular feature, structure, or characteristic described in connection with the embodiment is included in at least one embodiment of the disclosure. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises. a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skilled in the art to which this disclosure belongs. The system, methods, and examples provided herein are illustrative only and not intended to be limiting.

FIG. 1 illustrates a schematic block diagram depicting a method for intelligent management of a battery, according to an embodiment of the disclosure.

Referring to FIG. 1, in an embodiment, in a method, the battery may be a lithium-ion battery incorporated within one of a User Equipment (UE) and an electric vehicle. Examples of the UE may include, but are not limited to, a mobile phone, a laptop, a tablet, and device incorporating the lithium-ion battery. In an embodiment, the management of the battery may be performed based on an Artificial Intelligence (AI) technique. In another embodiment, managing the battery may result in or more of an improved battery life, an improved safety with respect to the battery and the UE and the vehicle. Moving forward, the subject matter may be configured to enhance a user experience for managing the battery.

In accordance with yet another embodiment of the subject matter, the method 100 includes, detecting at operation 102 at least one anomaly associated with the battery, wherein the at least one anomaly impacts one or more operations of the battery.

Continuing with the above embodiment, the method 100 includes identifying at operation 104 at least one portion of data from reference charging data to include the at least one anomaly for managing the one or more operations of the battery.

Subsequently, the method 100 includes modifying at operation 106 at least one portion of data from the reference charging data (based on a pre-determined logic) to include the at least one anomaly.

Continuing with the above embodiment, the method 100 includes retraining at operation 108 an AI model based on the reference charging data upon modification for managing the one or more operations of the battery.

Figure 2:
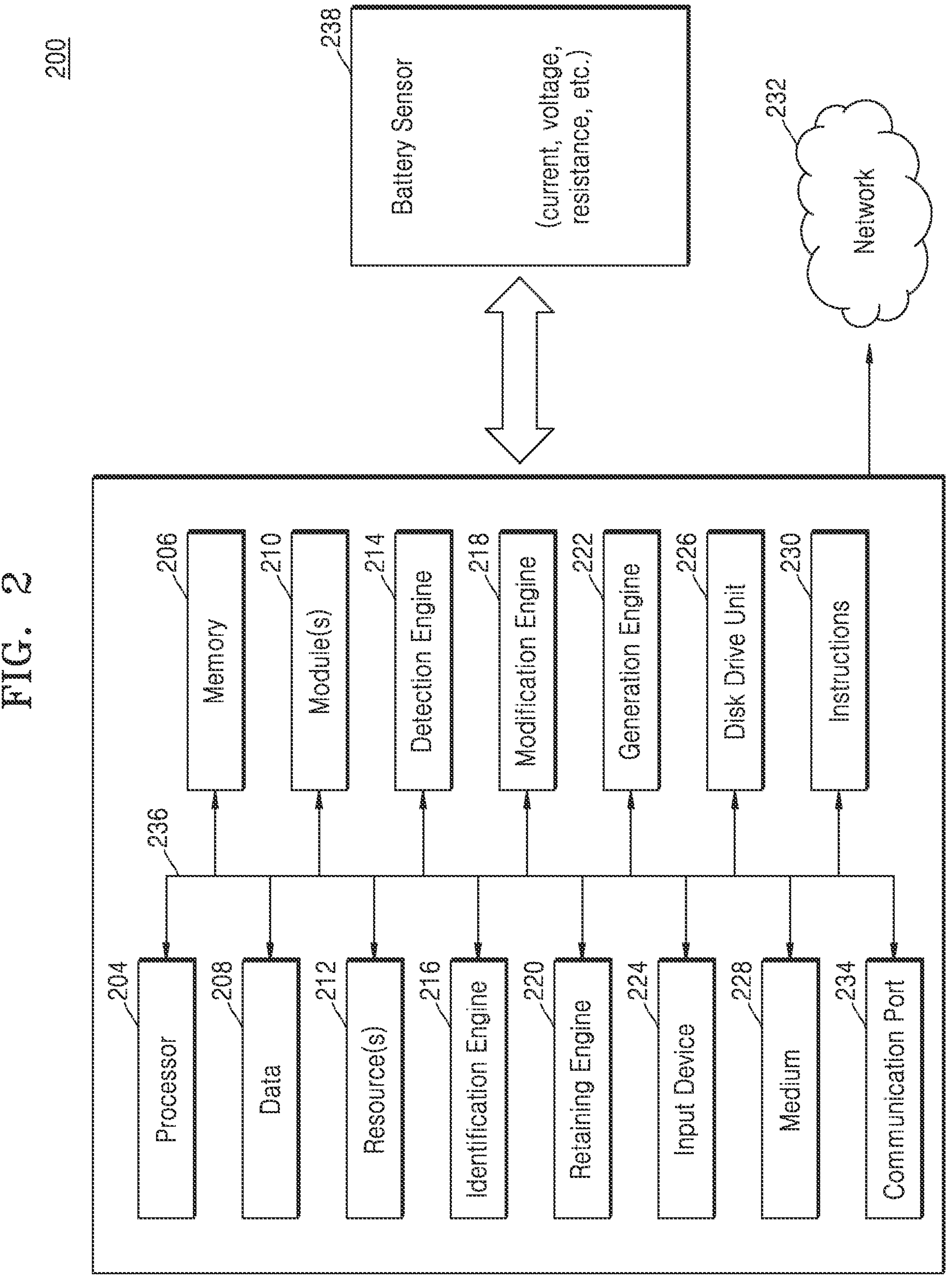
FIG. 2 illustrates a schematic block diagram of a system for management of a battery, according to an embodiment of the disclosure.

FIG. 2 illustrates a schematic block diagram of a system for management of a battery, according to an embodiment of the disclosure.

Referring to FIG. 2, in an embodiment, a system 202 may be configured to manage the battery by employing an AI technique. In an embodiment, the system 202 may be configured to perform an on-device management of the battery. In another embodiment, the system 202 may be configured to employ an Artificial Neural Network (ANN) for managing the battery through the AI technique. In an embodiment, management of the battery may include a training and the retraining of an AI model. In an embodiment, the system 202 may be triggered to train and retrain the AI model in response to detecting at least one anomaly related to the battery.

In an embodiment, the training of the AI model may be performed as a part of an off-line training. Furthermore, the retraining of the AI model may be performed on-device. In an embodiment, the retraining may be performed based on reference charging data. In an embodiment, the reference charging data may be modified based on the at least one anomaly prior to the retraining the AI model. In an embodiment, the system 202 may be configured to provide a higher accuracy for detecting the at least one anomaly. In an embodiment, the accuracy may be higher than 99.9%. In an embodiment, the system 202 may be configured to provide the higher accuracy upon implementing one or more of a handcrafted statistical technique and a neural network for classification of one or more parameters associated with the battery.

In an embodiment, the battery may be a lithium-ion battery incorporated within one of a User Equipment (UE) and an electric vehicle. Examples of the UE may include, but are not limited to, a mobile phone, a laptop, a tablet, and device incorporating the lithium-ion battery. Furthermore, the system 202 may be incorporated within one of the UE and the electric vehicles incorporating the battery.

In an embodiment, the system 202 may be configured to improve battery health and the system 202 may be configured to trigger a sudden change in a state of health of the battery to reflect improvement in measurement of the battery health. Subsequently, the system 202 may be configured to improve a remaining useful life of the battery and the system 202 may be configured to trigger a sudden change in the remaining useful life of the battery to reflect improvement in measurement of the remaining useful life.

Furthermore, the system 202 may be configured to reduce a time taken for charging the battery upon managing the battery based on the subject matter. In an embodiment, the system 202 may be configured to gradually decrease in a battery capacity loss caused due to a high frequency of charging the battery. In an embodiment, the system 202 may further be configured to reduce a battery degradation for improving a battery availability. In an embodiment, the system 202 may be configured to reduce the battery degradation by improving a charging and a discharging of the battery.

Continuing with the above embodiment, the system 202 may include a processor 204, a memory 206, data 208, module(s) 210, resource (s) 212, a detection engine 214, an identification engine 216, a modification engine 218, a retraining engine 220, and a generation engine 222. In an embodiment, the processor 204, the memory 206, the data 208, the module(s) 210, the resource (s) 212, the detection engine 214, the identification engine 216, the modification engine 218, the retraining engine 220, and the generation engine 222 may be communicably coupled to one another.

As would be appreciated, the system 202, may be understood as one or more of a hardware, and a configurable hardware, and the like. In an example, the processor 204 may be a single processing unit or a number of units, all of which could include multiple computing units. The processor may be implemented as one or more microprocessors, microcomputers, microcontrollers, digital signal processors, central processing units, processor cores, multi-core processors, multiprocessors, state machines, logic circuitries, application-specific integrated circuits, field-programmable gate arrays and/or any devices that manipulate signals based on operational instructions. Among other capabilities, the processor 204 may be configured to fetch and/or execute computer-readable instructions and/or data 208 stored in the memory 206.

In an example, the memory 206 may include any non-transitory computer-readable medium known in the art including, for example, volatile memory, such as static random access memory (SRAM) and/or dynamic random access memory (DRAM), and/or non-volatile memory, such as read-only memory (ROM), erasable programmable ROM (EPROM), flash memory, hard disks, optical disks, and/or magnetic tapes. The memory 206 may include the data 208.

In an embodiment, the memory 206 includes a cache or random access memory for the processor 204. In alternative examples, the memory 206 is separate from the processor 204, such as a cache memory of a processor, the system memory, or other memory. The memory 206 may be an external storage device or database for storing data. The memory 206 is operable to store instructions executable by the processor 204. The functions, acts or tasks illustrated in the figures or described may be performed by the programmed processor 204 for executing the instructions stored in the memory 206. The functions, acts or tasks are independent of the particular type of instructions set, storage media, processor or processing strategy and may be performed by software, hardware, integrated circuits, firmware, micro-code and the like, operating alone or in combination. Processing strategies may include multiprocessing, multitasking, parallel processing, and the like.

The data 208 serves, amongst other things, as a repository for storing data processed, received, and generated by one or more of, the processor 204, the memory 206, the module(s) 210, the resource (s) 212, the detection engine 214, the identification engine 216, the modification engine 218, the retraining engine 220, and the generation engine 222.

The module(s) 210, amongst other things, may include routines, programs, objects, components, data structures, and the like, which perform particular tasks or implement data types. The module(s) 210 may also be implemented as, signal processor(s), state machine(s), logic circuitries, and/or any other device or component that manipulate signals based on operational instructions.

The module(s) 210 may be implemented in hardware, instructions executed by at least one processing unit, for e.g., processor 204, or by a combination thereof. The processing unit may be a general-purpose processor which executes instructions to cause the general-purpose processor to perform operations or, the processing unit may be dedicated to performing the required functions. In another aspect of the disclosure, the module(s) 210 may be machine-readable instructions (software) which, when executed by a processor/processing unit, may perform any of the described functionalities.

The resource(s) 212 may be physical and/or virtual components of the system 202 that provide inherent capabilities and/or contribute towards the performance of the system 202. Examples of the resource(s) 212 may include, but are not limited to, a memory (e.g., the memory 206), a power unit (e.g. a battery), a display unit, and the like. The resource(s) 212 may include a power unit/battery unit, a network unit (e.g., the communication interface unit 408), and the like, in addition to the processor 204, the memory 206, and the display unit. In an embodiment, the display unit may be one of a liquid crystal display (LCD), an organic light-emitting diode (OLED), a flat panel display, a solid-state display, a cathode ray tube (CRT), a projector, a printer or other now known or later developed display device for outputting determined information. The display may act as an interface for the user to see the functioning of the processor 204, or specifically as an interface with the software stored in the memory 206 or the disk drive unit 226.

Additionally, the system 202 may include an input device 224 configured to allow a user to interact with any of the components of system 202. The system 202 may also include an optical drive unit (i.e., disk drive unit 226). The disk drive unit 226 may include a computer-readable medium 228 in which one or more sets of instructions 230, e.g. software, may be embedded. Further, the instructions 230 may embody one or more of the methods or logic as described. In a particular example, the instructions 230 may reside completely, or at least partially, within the memory 2504 or within the processor 204 during execution by the system 202.

The disclosure contemplates a computer-readable medium that includes instructions 230 or receives and executes instructions 230 responsive to a propagated signal so that a device connected to a network 232 can communicate voice, video, audio, images, or any other data over the network 232. Further, the instructions 230 may be transmitted or received over the network 232 via a communication port or interface 234 or using a bus 236. The communication port or interface 234 may be a part of the processor 204 or maybe a separate component. The communication port 234 may be created in software or maybe a physical connection in hardware. The communication port 234 may be configured to connect with a network 232, external media, the display unit, or any other components in system 202, or combinations thereof. The connection with the network 232 may be a physical connection, such as a wired Ethernet connection or may be established wirelessly as discussed later. The additional connections with other components of the system 202 may be physical or may be established wirelessly. The network 232 may alternatively be directly connected to the bus 236.

The network 232 may include wired networks, wireless networks, Ethernet AVB networks, or combinations thereof. The wireless network may be a cellular telephone network, an 802.11, 802.16, 802.20, 802.1Q or WiMax network. The network 826 may be a public network, such as the Internet, a private network, such as an intranet, or combinations thereof, and may utilize a variety of networking protocols now available or later developed including, but not limited to transmission control protocol (TCP)/internet protocol (IP) based networking protocols. The system is not limited to operation with any particular standards and protocols. For example, standards for Internet and other packet-switched network transmissions (e.g., TCP/IP, user datagram protocol (UDP)/IP, hypertext markup language (HTML), and hypertext transfer protocol (HTTP)) may be used.

In some example embodiments, the module(s) 210 may be machine-readable instructions (software) which, when executed by a processor/processing unit, perform any of the described functionalities.

Continuing with the above embodiment, the detection engine 214 may be configured to detect the at least one anomaly associated with the battery. In an embodiment, the at least one anomaly may be occurring in the battery. In an embodiment, the at least one battery may have occurred in the battery. In an embodiment, the at least one anomaly detected in the battery may impact one or more operations of the battery. In an embodiment, the one or more operations may correspond to providing power to any of the UE and the vehicle equipped with the battery. In an embodiment, the detection engine 214 may be configured to detect the at least one anomaly by detecting at least one disturbance.

Examples of the at least one battery may include, but are not limited to, sensing an impact on the battery such as sensing a motion, an extreme temperature and a temperature distribution on-device, detecting an abuse caused to the battery, unseen charge data, an individual charging behavior based on a state of health change of the battery, an individual dis-charging behavior based on the state of health change of the battery, when a number of charging cycles is logged by the UE, and one or more of a noise and a throttling in charging data due to temperature or another factor. Examples of the at least one disturbance may include, but are not limited to, a motion disturbance, a charging disturbance, and a temperature disturbance. In an embodiment, the disturbance may also be indicated based on an abuse caused to the battery.

In response to detecting the at least one anomaly by the detection engine 214, the identification engine 216 may be configured to identify at least one portion of data from the reference charging data. In an embodiment, the at least one portion of data may be identified to include the at least one anomaly for managing the one or more operations of the battery. In an embodiment, the reference charging data may include one or more parameters indicative of at least one ideally operating battery and at least one faulty battery. Moving forward, the identification engine 216 may be configured to identify the at least one portion of data by fetching the reference charging data from the memory 206. In an embodiment, the identification engine 216 may be configured to fetch the reference charging data from in response to detecting the at least one anomaly.

Subsequent to fetching the reference charging data, the identification engine 216 may be configured to receive one or more battery parameters associated with the battery as an input. Examples of the one or more battery parameters may include, but are not limited to, an Open Circuit Voltage (OCV), a voltage, and a probability of the battery being one of faulty and non-faulty.

In an embodiment, the identification engine 216 may be configured to communicate with a network of state of the art battery sensors 238 for measuring current voltage and resistance, and the like, with respect to the battery. Further, a system 202 is provided to receive the signals from the sensors 238.

In an embodiment, the identification engine 216 may be configured to receive the one or more battery parameters automatically from the memory 206 upon fetching the reference charging the data. In an embodiment, the one or more parameters may be pre-stored in the memory 206 upon receiving from the sensors 238. In an embodiment, the sensors 238 may include an OCV sensor, and a voltage sensor. In an embodiment, the identification engine 216 may further be configured to receive information depicting likelihood of particular data being part of an abuse class.

Moving forward, upon fetching the reference charging data and receiving the one or more battery parameters, the identification engine 216 may be configured to determine that the at least one anomaly impacts the at least one portion of data. In an embodiment, the identification engine 216 may be configured to determine that the at least one anomaly impacts the at least one portion of data based on identifying a change in the one or more battery parameters with respect to the at least one portion of data caused by the at least one anomaly. Based on the determination, the identification engine 216 may be configured to identify the at least one portion of data from the reference charging data.

Moving forward, upon identification of the at least portion of data by the identification engine 216, the modification engine 218 may be configured to modify the at least one portion of data from the reference charging data. In an embodiment, the at least one portion of data may be modified (based on a pre-determined logic) to include the at least one anomaly.

Subsequent to modification of the at least one portion of data by the modification engine 218, the generation engine 222 may be configured to generate a synthetic training data. Upon generation of the synthetic training data, the generation engine 222 may be configured to train an Artificial Intelligence (AI) model based on the synthetic training data. Subsequent to training of the AI model by the generation engine 222, the retraining engine 220 may be configured to retain the AI model based on the reference charging data. In an embodiment, the AI model may be retrained by the retraining engine 220 for managing the one or more operations of the battery.

In an embodiment, for retraining the AI model, the retraining engine 220 may be configured to divide the reference charging data into a number of segments. In response to dividing the reference charging data, the retraining engine 220 may be configured to perform a number of tests on the number of segments. In an embodiment, the number of tests may be performed to classify the reference charging data amongst one of faulty data and non-faulty data.

Moving forward, the retraining engine 220 may be configured to accommodate the faulty data and the non-faulty data within the reference charging data. In an embodiment, the accommodation may be performed through at-least one of identifying at least one layer in the AI model that needs to retrained, adding an additional classification framework to operate with the AI model, changing a re-training method of the AI model, and changing a charging or discharging behavior of the battery. Moving forward, the retraining engine 220 may further be configured to adapt a trained ANN to include the reference charging distribution data collected during a predefined time interval. In an embodiment, the reference charging distribution data may be referred as the reference charging data.

Figure 3:
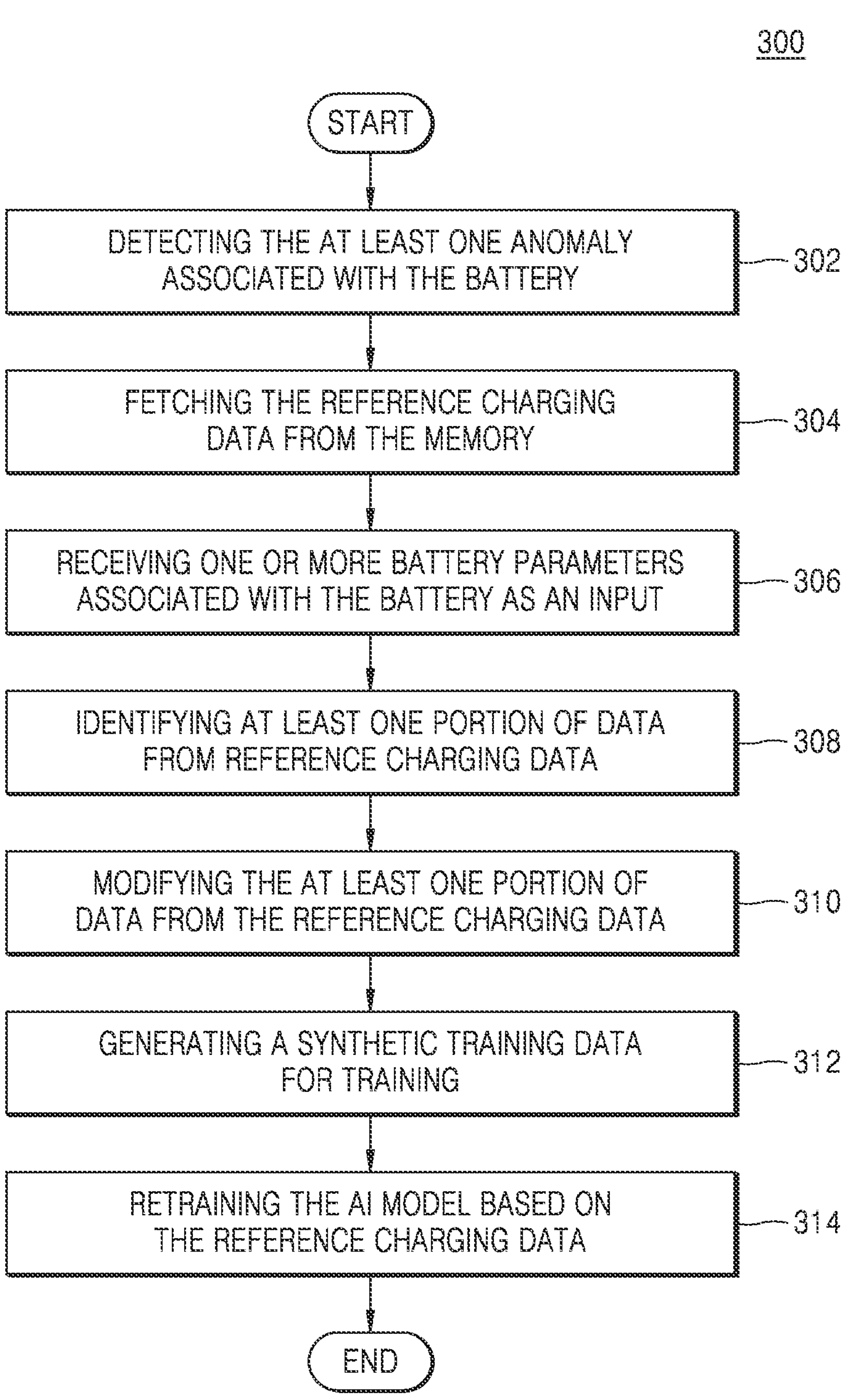
FIG. 3 illustrates an operational flow diagram depicting a process for management of a battery, according to an embodiment of the disclosure.

FIG. 3 illustrates an operational flow diagram depicting a process for management of a battery, according to an embodiment of the disclosure.

Referring to FIG. 3, in an embodiment, in a method 300, the management may include managing one or more operations of the battery. In an embodiment, the management may be based on employing an AI model for retraining data associated with the battery. In another embodiment, the management may further include detecting at least one anomaly and modifying the AI model based on the at least one anomaly for managing the one or more operations of the battery. In an embodiment, the process may be implemented by the system 202 as referred in the FIG. 2.

In an embodiment, the system 202 may be configured to improve battery health and the system 202 may be configured to trigger a sudden change in a state of health of the battery to reflect improvement in measurement of the battery health. Subsequently, the system 202 may be configured to improve a remaining useful life of the battery and the system 202 may be configured to trigger a sudden change in the remaining useful life of the battery to reflect improvement in measurement of the remaining useful life.

Furthermore, the system 202 may be configured to reduce a time taken for charging the battery upon managing the battery based on the subject matter. In an embodiment, the system 202 may be configured to gradually decrease in a battery capacity loss caused due to a high frequency of charging the battery. In an embodiment, the system 202 may further be configured to reduce a battery degradation for improving a battery availability. In an embodiment, the system 202 may be configured to reduce the battery degradation by improving a charging and a discharging of the battery.

In an embodiment, the process may include performing an on-device management of the battery. In an embodiment, the process may include employing a deep learning technique for managing the battery. In an embodiment, the process may be based on an Artificial Neural Network (ANN) for managing the battery through an AI technique. In an embodiment, the battery may be a lithium-ion battery incorporated within one of a User Equipment (UE) and an electric vehicle. Examples of the UE may include, but are not limited to, a mobile phone, a laptop, a tablet, and device incorporating the lithium-ion battery. Furthermore, the system 202 may be incorporated within one of the UE and the electric vehicles incorporating the battery.

Continuing with the above embodiment, the process may include detecting at operation 302, the at least one anomaly associated with the battery. In an embodiment, the detection may be performed by the detection engine 214 as referred in the FIG. 2. In an embodiment, the at least one anomaly may be occurring in the battery. In an embodiment, the at least one anomaly may have occurred in the battery. Examples of the at least one anomaly may include, but are not limited to, sensing an impact on the battery such as sensing a motion, an extreme temperature and a temperature distribution on-device, detecting an abuse caused to the battery, unseen charge data, an individual charging behavior based on a state of health change of the battery, an individual dis-charging behavior based on the state of health change of the battery, when a number of charging cycles is logged by the UE, and one or more of a noise and a throttling in charging data due to temperature or another factor.

In an embodiment, the at least one anomaly detected in the battery may impact one or more operations of the battery. In an embodiment, the one or more operations may correspond to providing power to any of the UE and the vehicle equipped with the battery. In an embodiment, the detection by the detection engine 214 may be detecting at least one disturbance. Examples of the at least one disturbance may include, but are not limited to, a motion disturbance, a charging disturbance, and a temperature disturbance. In an embodiment, the disturbance may also be depicted as an abuse caused to the battery. Examples of the abuse may include, increase in temperature of the battery, causing an external damage to the battery by impacting a present of the battery such as wear and tear, a change in status of health of the battery, and a change in remaining useful life of the battery.

Continuing with the above embodiment, in response to detecting the at least one anomaly by the detection engine 214, the process may proceed towards fetching at operation 304 the reference charging data from the memory 206. In an embodiment, the reference charging data may be fetched by the identification engine 216 from the memory 206 in response to detecting the at least one anomaly.

Subsequent to fetching the reference charging data, the process may proceed towards receiving at operation 306, one or more battery parameters associated with the battery as an input. In an embodiment, the one or more battery parameters may be received by the identification engine 216. Examples of the one or more battery parameters may include, but are not limited to, an Open Circuit Voltage (OCV), a voltage, and a probability of the battery being one of faulty and non-faulty. In an embodiment, the one or more battery parameters may be received by the identification engine 216 automatically from the memory 206 upon fetching the reference charging the data. In an embodiment, the process may further include receiving information depicting likelihood of particular data being part of an abuse class. In an embodiment, the identification engine 216 may be configured to communicate with a network of state of the art battery sensors 238 for measuring current voltage and resistance, and the like, with respect to the battery. Further, a system 202 is provided to receive the signals from the sensors 238. In an embodiment, the sensors 238 may include an OCV sensor, and a voltage sensor.

Moving forward, upon fetching the reference charging data and receiving the one or more battery parameters, the process may proceed towards identifying at operation 308, at least one portion of data from reference charging data. In an embodiment, the identification of the at least one portion of data may be performed by the identification engine 216 as referred in the FIG. 2. In an embodiment, the at least one portion of data may be identified to include the at least one anomaly for managing the one or more operations of the battery. In an embodiment, the reference charging data may include one or more parameters indicative of at least one ideally operating battery and at least one faulty battery.

In an embodiment, identification of the at least one portion of data may be based on determining that the at least one anomaly impacts the at least one portion of data. In an embodiment, the determination may be performed by the identification engine 216. In an embodiment, determining that the at least one anomaly impacts the at least one portion of data may be based on identifying a change in the one or more battery parameters with respect to the at least one portion of data caused by the at least one anomaly. Based on the determination, the process may include identifying the at least one portion of data from the reference charging data.

In an embodiment, the identification engine 216 may identify at least one portion of data from reference charging data to include the at least one anomaly for managing the one or more operations of the battery, using a classification framework. For example, the classification framework may be a pre-trained AI model or statistical model.

In an embodiment, the identification engine 216 may classify the type of the status of the battery using the pre-trained AI model that receives one or more battery parameters associated with the battery as an input. For example, the type of the status of the battery include healthy, swelling, high-temperature, bending, bottom side and the like.

Moving forward, upon identification of the at least portion of data by the identification engine 216, the process may include modifying at operation 310, the at least one portion of data from the reference charging data. In an embodiment, the modification may be performed by the modification engine 218 as referred in the FIG. 2. In an embodiment, the at least one portion of data may be modified based on a pre-determined logic to include the at least one anomaly.

In an embodiment, the modification may include modifying a reference distribution (current/voltage) of an identified mechanism. Furthermore, the modification may include modifying a classification framework such as a neural network. In an embodiment, the modification on the classification framework may be performed by retraining. In an embodiment, modification may further include adding an additional classification framework. Moving forward, the modification may include changing a re-training method of the framework. In an embodiment, the modification may be performed to a charging behavior of the battery and a dis-charging behavior for an optimal utilization of the battery.

Subsequent to modification of the at least one portion of data by the modification engine 218, the process may include generating at operation 312, a synthetic training data. In an embodiment, the synthetic training data may be generated by the generation engine 222 as referred in the FIG. 2. Upon generation of the synthetic training data, the process may proceed towards training an Artificial Intelligence (AI) model based on the synthetic training data. In an embodiment, the training may be performed by the generation engine 222.

Subsequent to training of the AI model by the generation engine 222, the process may proceed towards retraining at operation 314, the AI model based on the reference charging data. In an embodiment, the retraining may be performed by the retraining engine 220 as referred in the FIG. 2 for managing the one or more operations of the battery. In an embodiment, for retraining the AI model, the process may include dividing the reference charging data into a number of segments. In response to dividing the reference charging data, the process may include performing a number of tests on the number of segments.

In an embodiment, the reference charging data may be divided into the number of segments in a way that each of the number of segments may be collected over a short period of time. In an embodiment the short period of time may be 5 minutes. In an embodiment, the number of tests may be performed to classify the reference charging data amongst one of faulty data and non-faulty data. In an embodiment, the number of tests may perform in the short time period of 5 minutes.

Moving forward, the process may further include accommodating the faulty data and the non-faulty data within the reference charging data. In an embodiment, the accommodation may be performed through at-least one of identifying at least one layer in the AI model that needs to retrained, adding an additional classification framework to operate with the AI model, changing a re-training method of the AI model, and changing a charging or discharging behavior of the battery. Moving forward, the process may include adapting a trained ANN to include the reference charging distribution data collected during a predefined time interval. In an embodiment, the reference charging distribution data may be referred as the reference charging data.

Figure 4:
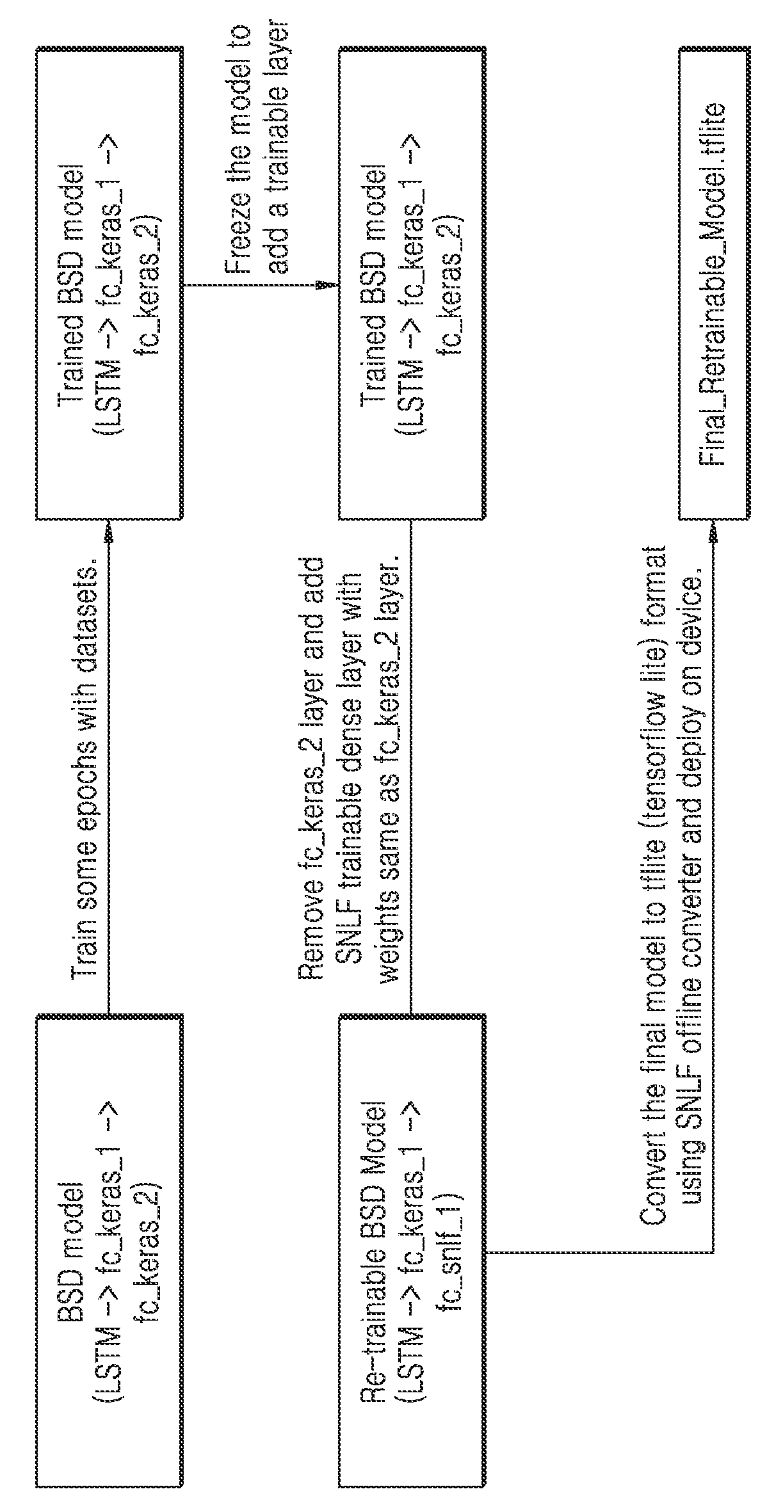
FIG. 4 illustrates an operational flow diagram depicting a process for on-device learning associated with a system, according to an embodiment of the disclosure.

FIG. 4 illustrates an operational flow diagram depicting a process for on-device learning associated with a system, according to an embodiment of the disclosure.

Referring to FIG. 4, in an embodiment, in a method 400, the on-device learning may be associated with on-device management of a battery by the system 202. In another embodiment, the battery and the system 202 may be incorporated within one of a UE and a vehicle.

In an embodiment, the process may include detecting an anomaly during a multitude of usage scenarios of the battery. In an embodiment, the anomaly may be referred as an at least one anomaly as referred in the FIG. 1. Examples of the at least one battery may include, but are not limited to, sensing an impact on the battery such as sensing a motion, an extreme temperature and a temperature distribution on-device, detecting an abuse caused to the battery, unseen charge data, an individual charging behavior based on a state of health change of the battery, an individual dis-charging behavior based on the state of health change of the battery, when a number of charging cycles is logged by the UE, and one or more of a noise and a throttling in charging data due to temperature or another factor. In an embodiment, the anomaly may be detected using a deep learning module within 1% error using data for a period of time. In an embodiment, the period of time may be of 5 minutes. In an embodiment, the process may include performing an on-device on the fly gauging for the on-device learning of the battery by the system 202. In an embodiment, the process may include utilizing a Neural Learning Framework (NLF).

Furthermore, a last trainable layer in a BSD model may be used for training one or more epochs with datasets. In an embodiment, the BSD model may be associated with the on-device retraining of the system 202 using device data generated after charging of the battery. Furthermore, the process may include freezing a model for adding the last trainable layer. In an embodiment, the model may be the AI model as referred in the FIG. 2. In an embodiment, the process may include removing a fc_keras_2 layer and adding an NLF trainable dense layer. In an embodiment, the fc_keras_2 layer may be selected for removal based on a trial and error method. In an embodiment, upon trial, it may be determined that amongst the fc_keras_2 layer and fc_keras_1 layer, fc_keras_2 layer is the most effective. In an embodiment, weights associated with the NLF trained layer may be similar to the fc_keras_2 layer. Moving forward, the process may include converting the final model to a tflite (tensorflow) lite format using an NLF convertor. Furthermore, the final model may be deployed on the UE incorporating the battery and the system 202. In an embodiment, the process may be implemented using an Application Programming Interface (API) of the NLF.

Figure 5:
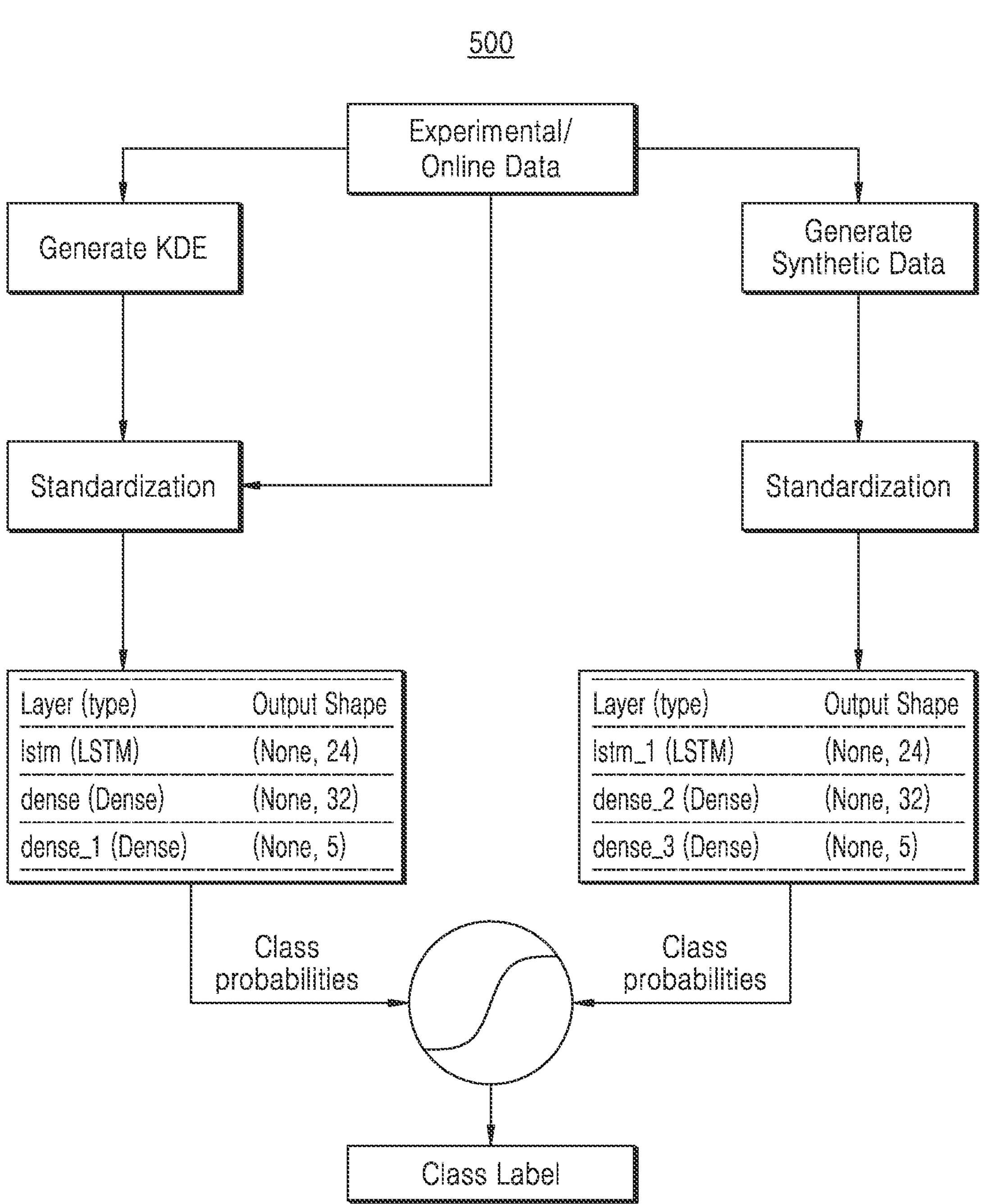
FIG. 5 illustrates an operational flow diagram depicting a process for predicting C-rate change associated with unseen data, according to an embodiment of the disclosure.

FIG. 5 illustrates an operational flow diagram depicting a process for predicting C-rate change associated with unseen data, according to an embodiment of the disclosure.

Referring to FIG. 5, in an embodiment, in a method 500, predicting the C-rate change related to the unseen data may be a part of offline training. In another embodiment, a long short-term memory (LSTM) model may be utilized for enhancing an applicability by adapting a classification framework. In an embodiment, the applicability may be enhanced for including different charging rates that may not be part of experimentally generated training data. In an embodiment, the applicability may be associated with the system 202 for on-device retraining for managing one or more operations of the battery. In an embodiment, an AI model within the system 202 may use one or more parameters such as OCV and Resistance (R) for data generation. In an embodiment, real data and synthetic training data may be incorporated within the AI model.

In an embodiment, the subject matter may include a number of advantages. In an embodiment, the number of advantages may include an improvement in battery safety by reducing errors in classification. Furthermore, a cause of an abuse faced by the battery may also be identified by employing the subject matter. Moving forward, the number of advantages may further include reduction in a device to device to variation, an improvement in safety by increasing a classification accuracy. Furthermore, accidents may be averted by alerting a user. Moving ahead, the subject matter further include capability of improving the safety conditions by including one or more conditions that were not a part of training data. In an embodiment, the subject matter is capable of providing a higher accuracy for detecting at least one anomaly. In an embodiment, the accuracy may be higher than 99.9%.

While the disclosure, has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method for intelligent management of a battery, the method comprising:

detecting at least one anomaly associated with the battery, the at least one anomaly impacting one or more operations of the battery;

identifying at least one portion of data associated with the detected at least one anomaly from reference charging data, wherein the reference charging data comprises one or more parameters indicative of at least one nominally operating battery and at least one faulty battery;

modifying at least one portion of data from the reference charging data to include the at least one anomaly; and retraining an artificial intelligence (AI) model based on the reference charging data upon modification for managing the one or more operations of the battery.

2. The method of claim 1, wherein the detecting of the at least one anomaly comprises detecting at least one disturbance including at least one of a motion disturbance, a charging disturbance, and a temperature disturbance.

3. The method of claim 1, wherein the identifying of the at least one portion of data from the reference charging data is based on:

fetching the reference charging data from a memory in response to detecting the at least one anomaly;

receiving one or more battery parameters associated with the battery as an input; and identifying the at least one portion of data from the reference charging data based on a determination that the at least one anomaly impacts the at least one portion of data.

4. The method of claim 3, wherein the determination that the at least one anomaly impacts the at least one portion of data is further based on a change in the one or more battery parameters with respect to the at least one portion of data caused by the at least one anomaly.

5. The method of claim 3, wherein the one or more battery parameters comprise an open circuit voltage (OCV), a voltage, and a probability of the battery being one of faulty and non-faulty.

6. The method of claim 1, further comprising:

generating a synthetic training data and training the AI model based on the synthetic training data; and retraining the AI model based on the reference charge data modified based on detecting the at least one anomaly.

7. The method of claim 5, wherein the retraining of the AI model is based on:

dividing the reference charging data into a plurality of segments;

performing a plurality of tests on the plurality of segments for classifying the reference charging data as one of faulty and non-faulty; and accommodating the faulty and non-faulty data within the reference charging data through at-least one of:

identifying at least one layer in the AI model that needs to be retrained, adding an additional classification framework to operate with the AI model, changing a re-training method of the AI model, or changing a charging or discharging behavior of the battery.

8. The method of claim 1, wherein the retraining of the AI model comprises:

adapting a trained artificial neural network (ANN) to include the reference charging data collected during a predefined time interval.

9. An electronic device for intelligent management of a battery, the electronic device comprising:

memory, comprising one or more storage media, storing instructions; and at least one processor communicatively coupled to the memory, wherein the instructions, when executed by the one or more processors individually or collectively, cause the electronic device to:

detect at least one anomaly associated with the battery, the at least one anomaly impacting one or more operations of the battery, identify at least one portion of data associated with the detected at least one anomaly from reference charging data, wherein the reference charging data comprises one or more parameters indicative of at least one nominally operating battery and at least one faulty battery, modify at least one portion of data from the reference charging data to include the at least one anomaly, and retrain an artificial intelligence (AI) model based on the reference charging data upon modification for managing the one or more operations of the battery.

10. The electronic device of claim 9, wherein, when detecting the at least one anomaly, the instructions, when executed by the at least one processor individually or collectively, further cause the electronic device to:

detect at least one disturbance including at least one of a motion disturbance, a charging disturbance, and a temperature disturbance.

11. The electronic device of claim 9, wherein, when identifying the at least one portion of data from the reference charging data, the instructions, when executed by the at least one processor individually or collectively, further cause the electronic device to:

fetch the reference charging data from a memory in response to detecting the at least one anomaly, receive one or more battery parameters associated with the battery as an input, and identify the at least one portion of data from the reference charging data based on a determination that the at least one anomaly impacts the at least one portion of data.

12. The electronic device of claim 11, wherein the determination of the at least one portion of data is further based on a change in the one or more battery parameters with respect to the at least one portion of data caused by the at least one anomaly.

13. The electronic device of claim 11, wherein the one or more battery parameters comprise an Open Circuit Voltage (OCV), a voltage, and a probability of the battery being one of faulty and non-faulty.

14. The electronic device of claim 13, wherein, when retraining the AI model, the instructions, when executed by the at least one processor individually or collectively, further cause the electronic device to:

divide the reference charging data into a plurality of segments, perform a plurality of tests on the plurality of segments for classifying the reference charging data as one of faulty and non-faulty, and accommodate the faulty and non-faulty data within the reference charging data through at-least one of:

identifying at least one layer in the AI model that needs to be retrained, adding an additional classification framework to operate with the AI model, changing a re-training system of the AI model, or changing a charging or discharging behavior of the battery.

15. The electronic device of claim 9, wherein the instructions, when executed by the at least one processor individually or collectively, further cause the electronic device to:

generate a synthetic training data and training the AI model based on the synthetic training data, and retrain the AI model based on the reference charge data modified based on detecting the at least one anomaly.

16. The electronic device of claim 9, wherein, when retraining the AI model, the instructions, when executed by the at least one processor individually or collectively, further cause the electronic device to:

adapt a trained artificial neural network (ANN) to include the reference charging data collected during a predefined time interval.

17. The electronic device of claim 9, wherein the at least one anomaly is determined based on sensing a state of the battery or detecting abuse to battery.

18. The electronic device of claim 17, wherein the sensing the state of the battery comprises sensing one of an impact on the battery via motion, an extreme temperature of the battery or a temperature distribution on-device.

* * * * *